United States Patent [19]

Hui et al.

[11] Patent Number: 5,223,704
[45] Date of Patent: Jun. 29, 1993

[54] PLANAR BURIED QUANTUM WELL PHOTODETECTOR

[75] Inventors: Sanghee P. Hui; Shin-Shem Pei, both of New Providence, N.J.

[73] Assignee: AT&T Bell Laboratories, Murray Hill, N.J.

[21] Appl. No.: 860,853

[22] Filed: Mar. 31, 1992

[51] Int. Cl.$^5$ .................. H01J 40/14; H01L 27/14
[52] U.S. Cl. ..................... 250/214.1; 257/21
[58] Field of Search ............ 250/211 J, 338.4, 370.01, 250/370.14; 357/45 L, 16, 30 E, 4; 257/21

[56] References Cited

U.S. PATENT DOCUMENTS

| | | | |
|---|---|---|---|
| 4,745,452 | 5/1988 | Sollner | 357/30 E |
| 4,764,246 | 8/1988 | Bridges et al. | 357/30 E |
| 4,894,526 | 1/1990 | Bethea et al. | |
| 4,933,728 | 6/1990 | Fukuzawa et al. | 357/30 E |
| 5,012,301 | 4/1991 | Xu et al. | 357/30 E |
| 5,027,164 | 6/1991 | Awano | 357/30 E |
| 5,051,804 | 9/1991 | Morse et al. | 357/30 E |
| 5,075,749 | 12/1991 | Chi et al. | 357/30 E |
| 5,115,442 | 5/1992 | Lee et al. | 357/4 |
| 5,117,477 | 5/1992 | Satoh | 357/30 E |

FOREIGN PATENT DOCUMENTS

| | | | |
|---|---|---|---|
| 0204988 | 9/1986 | Japan | 357/30 E |
| 0009987 | 1/1988 | Japan | 357/30 E |
| 0133581 | 6/1988 | Japan | 357/30 E |
| 0134978 | 5/1989 | Japan | 357/30 E |
| 0297868 | 11/1989 | Japan | 357/30 E |
| 0199877 | 8/1990 | Japan | 357/30 E |

Primary Examiner—David C. Nelms
Assistant Examiner—Michael Messinger
Attorney, Agent, or Firm—Glen E. Books

[57] ABSTRACT

Using ion implant isolation, applicant has demonstrated a substantially planar quantum well photodetector free of exposed mesa side walls and having performance characteristics comparable with conventional mesa QWIPs. The planar photodetector presents a topography well suited for integration with other electronic components and the planar structure can be scaled to diameters much smaller than are typically useful in the conventional bonded devices.

4 Claims, 3 Drawing Sheets

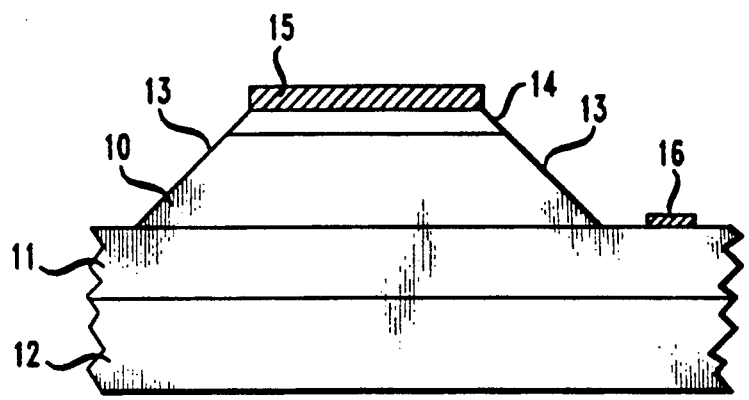
FIG. 1
(PRIOR ART)
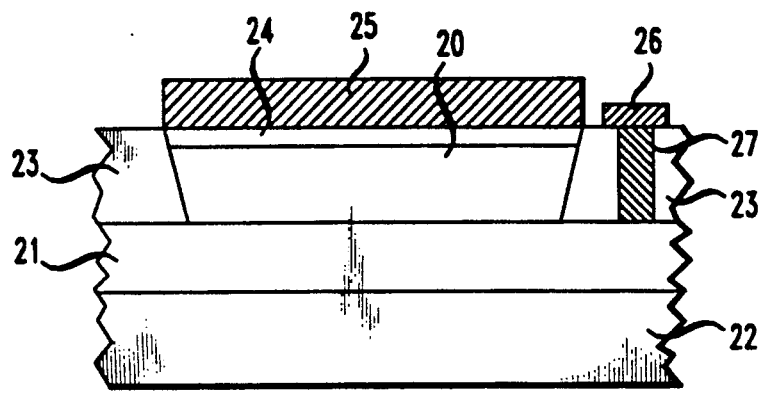
FIG. 2
FIG. 3
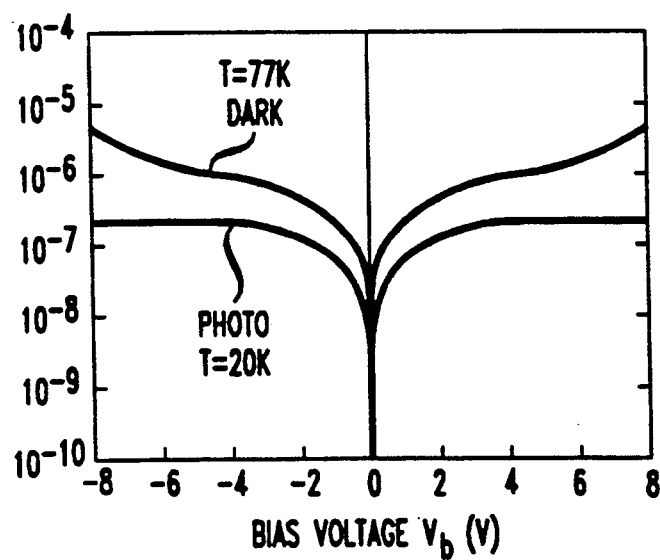

SCALING OF IMPLANT ISOLATED QWIP (77 K DARK CURRENT AT ±0.52 AND ±2.4V)

SCALING OF IMPLANT ISOLATED QWIP (PHOTO CURRENT AT ±2.4 WITH 0.1 APERATURE)

PLANAR BURIED QUANTUM WELL PHOTODETECTOR

FIELD OF THE INVENTION

This invention relates to quantum well photodetectors and, in particular, to such a photodetector which is essentially planar in surface topography.

BACKGROUND OF THE INVENTION

Photodetectors are of interest in a wide variety of fields including optical communications, image sensing and instrumentation. Because of their low dark current and high responsivity, quantum well infrared photodetectors (QWIPs) offer considerable promise as high speed infrared photodetectors.

A particularly advantageous QWIP structure is disclosed in U.S. Pat. No. 4,894,526 to C. G. Bethea et al entitled Infrared Radiation Detector. In one embodiment the QWIP comprises a plurality of GaAs/AlGaAs quantum wells having a single bound state for electrons. Incident infrared radiation excites electrons from their bound state into the conduction band where they contribute to collected current.

A limitation of prior art QWIPs is that the quantum well regions are typically fabricated as mesa structures arising three or more micrometers from the underlying n+ semiconductor contact layer. The mesas present an extreme topography which is not readily compatible with integration of other electronic devices on the same substrate. Moreover the side walls expose the active area of the device to the degrading effects of contamination and radiation. Because the mesa topography is not suitable for integration, the conventional QWIPs must be fabricated in dimensions sufficiently large to be aligned and bonded to other substrates containing integrated circuits. Although smaller mesas would be desirable, this bonding requirement limits the minimum mesa diameter to about 30 micrometers. Accordingly, there is a need for a QWIP structure which eliminates mesa topography.

SUMMARY OF THE INVENTION

Applicant has demonstrated that ion implant isolation permits fabrication of a substantially planar quantum well photodetector free of exposed mesa side walls and having performance characteristics comparable with conventional mesa QWIPs. The planar photodetector presents a topography well suited for integration with other electronic components, and the planar structure can be scaled to dimensions smaller than conventional bonded devices.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 is a schematic cross section of a conventional mesa quantum well infrared photodetector;

FIG. 2 is a schematic cross section of a planar quantum well photodetector in accordance with the invention;

FIG. 3 is a graphical illustration of the current versus voltage curve of the device of FIG. 2.

Figure 4:
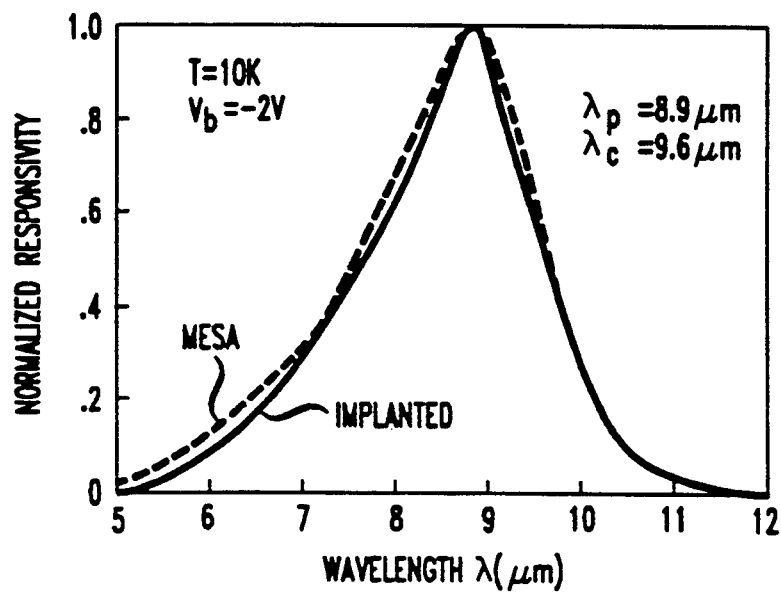
FIGS. 4 and 5 are graphical illustrations comparing performance characteristics of the devices of FIGS. 1 and 2.

It is to be understood that these drawings are for purposes of illustrating the concepts of the invention and, except for graphical illustrations, are not to scale.

DETAILED DESCRIPTION

Referring to the drawings, FIG. 1 is a schematic cross section of a conventional mesa quantum well infrared photodetector useful in understanding the limitations of the prior art. In essence the conventional QWIP comprises a plurality of quantum wells referred to as a multiple quantum well stack 10 in the form of a mesa rising from an n+ surface 11 of a gallium arsenide substrate 12. A second n+ region 14 is disposed on the upper surface of the mesa to act as a contact layer, and upper and lower ohmic contacts 15 and 16, respectively, are formed on the n+ layers by methods well known in the art. Examples of such devices are described in the above-cited Bethea et al '526 patent.

Limitations of this conventional structure may be seen in FIG. 1. The mesa, which is typically about four micrometers in height above surface 11 has large, exposed side walls 13. The extreme topography presented by the mesa is not readily compatible with integration of other components on the same chip. In addition the exposed sidewalls expose the active area of the device to the degrading effects of contamination and radiation.

FIG. 2 is a schematic section of a QWIP in accordance with the invention which avoids extreme mesa topography, is free of exposed side walls and presents a geometry compatible with integration of other components. In essence, the QWIP of FIG. 2 comprises a multiple quantum well stack 20 grown from an n+ surface 21 of a gallium arsenide substrate 22. Instead of mesa isolation, however, the stack 20 is isolated by ion implantation in the neighboring regions 23. A second n+ region 24 is disposed on the top of the multiquantum well stack to act as a contact layer. A conductive path 27 is provided to surface 21 by etching a via or implanting through region 23, and metal contacts 25 and 26 are made.

The fabrication and structure of the invention can be understood in greater detail by consideration of the following specific example. The exemplary structure can be conveniently fabricated by using molecular beam epitaxy (MBE) to grow the layers for the contacts and the multiple quantum well stack on a semiconductor substrate.

The first step in the fabrication process is to provide a semiconductor substrate such as gallium arsenide and to form a contact layer 21, such as a one micrometer thick layer of n+ doped gallium arsenide.

The next step is to grow the multiple quantum well stack 20 as by growing 50 periods of 40 angstrom GaAs quantum wells (n-doped to a concentration $1 \times 10^{18}$ cm$^{-3}$) and 500 angstrom Al$_{0.28}$Ga$_{0.72}$As barriers.

The top contact layer 24 grown on the top of stack 20 can be 0.5 micrometers of n+ doped gallium arsenide.

After the requisite layers are grown, the active quantum well region is masked. Here the quantum well region is defined by photolithographically forming circular dots of thick photoresist (about 5 micrometers thickness) over the upper surface and using the dots as masks for ion implantation isolation. A plurality of different size devices were made by using different diameter dots of 15, 25, 50, 100 and 200 micrometers. Specifically, the stack 20 is isolated by subjecting the neighboring regions 23 to multiple F+ (alternatively O+) and H+ implants with energies up to 200 and 350 KeV, and doses up to $8 \times 10^{12}$ and $1 \times 10^{15}$ cm$^{-2}$, respectively.

In the final steps the photoresist is stripped, and the stripped devices are annealed at 500° C. for 5 min. in order to maximize the resistivity of the implanted regions. Conductive paths 27 are made to the lower n+ contact layer 21, either through vias or implanted regions, and ohmic metal contacts 25 and 26 provide contact to layers 21 and 24 in accordance with techniques well known in the art.

The resulting QWIPs were then tested. A 200 micron implanted QWIP was tested in comparison with a mesa isolated QWIP of the same size and layer structure. The current-voltage curves for both QWIPs were measured and found to identical within experimental error. FIG. 3 shows (for either device) the dark current curves measured at T=77K and the window photocurrent curves measured at T=20K. Since the dark current is extremely sensitive to the quality of the aluminum gallium arsenide barriers, FIG. 3 demonstrates that the ion implantation and anneal process does not produce any substantial concentration of defects or traps in the barrier layers.

The two devices were then provided with 45° facets polished on the substrates to permit optical coupling, and the responsivities of the devices were measured as a function of wavelength. The results are plotted in FIG. 4 with the dashed curve for the mesa QWIP and the solid curve for the planar QWIP. As can be seen, the normalized responsivity spectra are nearly the same, showing no measurable degradation of device performance due to ion implantation.

Figure 5:
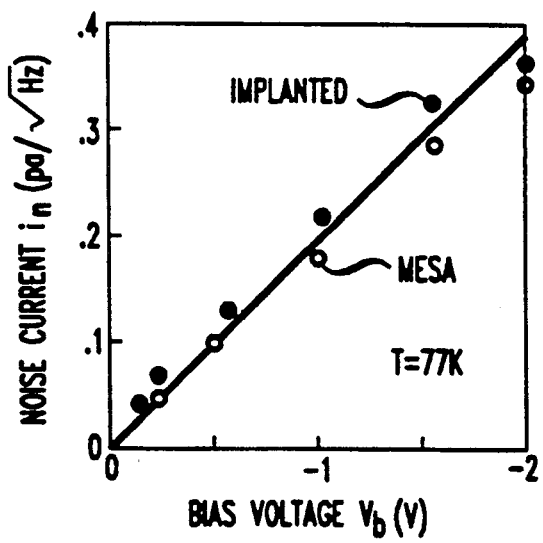

The next test was to measure current noise as a function of bias voltage at T=77K. The results, shown in FIG. 5, show that the mesa and planar devices perform the same. Thus with no loss in performance, QWIPs can be made in planar form suitable for monolithic integration with other devices such as signal processing electronics.

Figure 6:
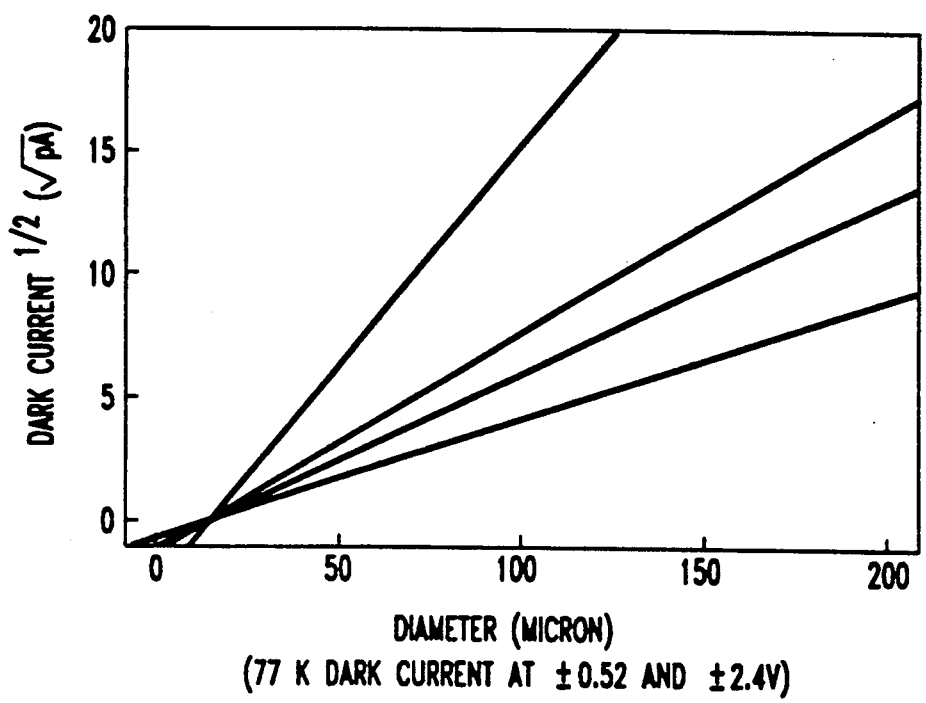
FIGS. 6-7 are graphical illustrations comparing performance characteristics of different size devices of the type shown in FIG. 2.

Next the different diameter implanted devices were tested in comparison with one another to determine whether the process can be used to make smaller devices of comparable quality. FIG. 6 shows the dark current measured at ±0.52 and ±2.4 V for implanted devices of different diameter. As can be seen, there is an excellent linear fit of the square root of dark current to device diameter. The fit demonstrates that the implantation perimeter contributes little to the thermionic current. The fact that the linear fitted lines intersect the x-axis at about 11 micrometers suggests that about 5.5 micrometers of each device radially within the perimeter is electrically inactive due to the combination of implantation and rapid thermal annealing.

Figure 7:
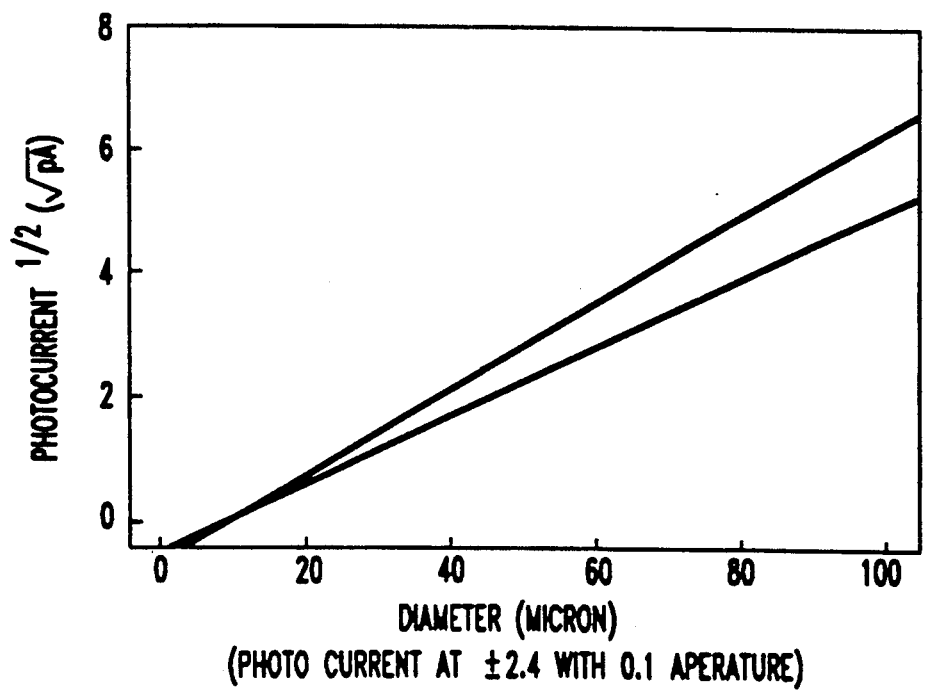

FIG. 7 shows the window photocurrent measured at ±2.4 V for several different diameter devices, and FIG. 8 shows the ratio of window current to the dark current. The constant ratios over a wide range of device size demonstrates the scalability of the technology. In addition current noise scaled with device size. Thus, the detectivity of the implanted devices is comparable to the detectivity of mesa devices and independent of device size, permitting the fabrication of devices comparable in quality to conventional mesa devices but smaller in size and compatible with integrated circuit fabrication.

It is to be understood that the above-described embodiments are illustrative of only some of the many possible specific embodiments which can represent applications of the principles of the invention. For example, while the invention has been described in the context of a preferred gallium arsenide materials system, other materials systems such as indium phosphide and gallium antimonide those skilled in the art without departing from the spirit and scope of the invention.

We claim:

1. In a quantum well photodetector of the type comprising a multiple quantum well stack disposed between a pair of contact layers and respective ohmic contacts, the improvement wherein said quantum well stack and at least one of said contact layers are buried within a semiconductor workpiece.

2. The improved photodetector of claim 1, wherein said quantum well stack is isolated by ion implantation.

3. The improved photodetector of claim 1, wherein said contact layers are n doped gallium arsenide, and said buried quantum well stack comprises gallium arsenide quantum wells disposed between aluminum gallium arsenide barriers.

4. The improved photodetector of claim 1 or claim 2 or claim 3 wherein the device has a diameter of less than 30 micrometers.

* * * * *